(12) United States Patent
Iguchi

(10) Patent No.: US 9,577,032 B2
(45) Date of Patent: Feb. 21, 2017

(54) SEMICONDUCTOR DEVICE

(71) Applicant: FUJI ELECTRIC CO., LTD., Kawasaki-shi (JP)

(72) Inventor: Kenichi Iguchi, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/485,517

(22) Filed: Sep. 12, 2014

(65) Prior Publication Data
US 2015/0001688 A1 Jan. 1, 2015

Related U.S. Application Data

(63) Continuation of application No. PCT/JP2013/061311, filed on Apr. 16, 2013.

(30) Foreign Application Priority Data

May 18, 2012 (JP) ................................. 2012-114301

(51) Int. Cl.
| | |
|---|---|
| *H01L 29/06* | (2006.01) |
| *H01L 29/739* | (2006.01) |
| *H01L 23/00* | (2006.01) |
| *H01L 29/66* | (2006.01) |
| *H01L 29/16* | (2006.01) |

(52) U.S. Cl.
CPC .......... *H01L 29/0603* (2013.01); *H01L 24/06* (2013.01); *H01L 29/0657* (2013.01); *H01L 29/6606* (2013.01); *H01L 29/7395* (2013.01); *H01L 29/1608* (2013.01); *H01L 2224/0601* (2013.01); *H01L 2924/10155* (2013.01); *H01L 2924/1305* (2013.01); *H01L 2924/13055* (2013.01);
(Continued)

(58) Field of Classification Search
None
See application file for complete search history.

(56) References Cited

U.S. PATENT DOCUMENTS 5,445,974 A * 8/1995 Whitney ................. H01L 29/86
257/E29.325
7,821,014 B2 10/2010 Yonezawa et al.
(Continued)

FOREIGN PATENT DOCUMENTS

| JP | 9-102604 A | 4/1997 |
| JP | 2003-303966 A | 10/2003 |
(Continued)

*Primary Examiner* — William Coleman
*Assistant Examiner* — Kien Ly
(74) *Attorney, Agent, or Firm* — Rabin & Berdo, P.C.

(57) ABSTRACT

A groove for air ventilation is formed in a rib with a substantially rectangular ring shape which is provided so as to surround a concave portion provided in a rear surface of a semiconductor chip. The groove is provided in each side or at each corner of the rib so as to traverse the rib from the inner circumference to the outer circumference of the rib. The depth of the groove is equal to or less than the depth of the concave portion provided in the rear surface of the chip. In this way, it is possible to reliably solder a semiconductor device, in which the concave portion is provided in the rear surface of the semiconductor chip and the rib is provided in the outer circumference of the concave portion, to a base substrate, without generating a void in a drain electrode provided in the concave portion.

16 Claims, 13 Drawing Sheets

(52) U.S. Cl.
CPC ............... *H01L 2924/13091* (2013.01); *H01L 2924/15787* (2013.01)

(56) References Cited

U.S. PATENT DOCUMENTS

| | | | |
|---|---|---|---|
| 2002/0041003 A1* | 4/2002 | Udrea ................... | H01L 21/764 257/502 |
| 2003/0215985 A1* | 11/2003 | Kouno ............... | H01L 29/66333 438/135 |
| 2005/0156283 A1* | 7/2005 | Tokuda ............... | H01L 29/0657 257/622 |
| 2005/0208738 A1* | 9/2005 | Tokano ............... | H01L 23/3192 438/464 |
| 2006/0131737 A1* | 6/2006 | Im ...................... | H01L 23/3128 257/717 |
| 2007/0210316 A1 | 9/2007 | Yonezawa et al. | |
| 2007/0278511 A1* | 12/2007 | Ohno ..................... | H01L 24/32 257/99 |
| 2008/0185647 A1* | 8/2008 | Wells ........................... | 257/347 |
| 2009/0213546 A1* | 8/2009 | Hassani ............. | H01L 23/3677 361/702 |
| 2010/0140638 A1* | 6/2010 | Kotani ................ | B29C 45/0001 257/98 |
| 2010/0148318 A1* | 6/2010 | Wang .................. | H01L 31/0236 257/627 |
| 2012/0193662 A1* | 8/2012 | Donofrio ................ | H01L 33/60 257/98 |

FOREIGN PATENT DOCUMENTS

| | | | |
|---|---|---|---|
| JP | 2004-281551 A | | 10/2004 |
| JP | 2006-156658 A | | 6/2006 |
| JP | 2006156658 A | * | 6/2006 |
| JP | 2007-243080 A | | 9/2007 |
| JP | 2010-283185 A | | 12/2010 |
| JP | 2011-040597 A | | 2/2011 |

* cited by examiner

SEMICONDUCTOR DEVICE

This application is a continuation under 35 U.S.C. 120 of International Application PCT/JP2013/061311 having the International Filing Date of Apr. 16, 2013, and having the benefit of the earlier filing date of Japanese Application No. 2012-114301, filed May 18, 2012. All of the identified applications are fully incorporated herein by reference.

TECHNICAL FIELD

The present invention relates to a semiconductor device, such as a vertical transistor or a vertical diode in which a current flows in a thickness direction of a semiconductor substrate.

BACKGROUND ART

In recent years, the following semiconductor devices have been proposed: a horizontal element in which a current flows in a direction parallel to one main surface of a semiconductor substrate on the one main surface side; and a vertical element in which a current flows in a thickness direction of the semiconductor substrate. In the vertical element, it is effective to reduce the thickness of the semiconductor substrate in the range in which a desired breakdown voltage can be maintained, in order to reduce on-resistance during an operation to reduce electrical connection loss. In general, an element structure is formed on the front surface side of a thick semiconductor substrate and the rear surface of the semiconductor substrate is ground and polished to manufacture (produce) a thin semiconductor substrate (semiconductor chip). However, when the thickness of the semiconductor substrate is reduced, the mechanical strength of the semiconductor substrate is insufficient and there is a concern that the semiconductor substrate will be broken while a semiconductor chip is being manufactured.

The following Patent Document 1 discloses a semiconductor device including a metal-oxide-semiconductor field effect transistor (MOSFET) and a bipolar transistor. In the semiconductor device, a concave portion is provided in a portion of the rear surface of the chip in a MOSFET region and a drain electrode is provided on the bottom of the concave portion. According to this structure, it is possible to locally reduce the thickness of the semiconductor chip and to reduce on-resistance, while maintaining the mechanical strength of the entire semiconductor chip.

In the above-mentioned Patent Document 1, silicon (Si) is used as a semiconductor material. However, in recent years, silicon carbide (SiC) or gallium nitride (GaN) has been used. The reason is that SiC or GaN has a wider band gap than Si and the critical electric field intensity of SiC or GaN is ten times more than that of Si. Therefore, the thickness of a SiC chip or a GaN chip can be reduced to about a tenth of the thickness of a Si chip.

For example, in the case of an insulated gate bipolar transistor (IGBT) with a design breakdown voltage of 600 V to 1200 V, the Si chip requires a thickness of 70 μm to 180 μm and the SiC chip requires a small thickness of 20 μm or less. However, since the thin semiconductor chip has weak mechanical strength, it is difficult to treat the thin semiconductor chip without any change.

In order to solve the problems, the following Patent Document 2 to Patent Document 4 disclose a technique in which a concave portion is provided in the rear surface of a SiC chip to locally reduce the thickness of the SiC chip, thereby reducing on-resistance. For example, the following Patent Document 2 discloses a vertical MOSFET using SiC in which a concave portion is provided in the rear surface of the chip and a drain electrode is provided on the bottom of the concave portion to reduce on-resistance, similarly to the following Patent Document 1.

However, in the following Patent Document 2, the thickness of the SiC chip in a portion other than the portion in which the concave portion is provided is 400 μm and the thickness of the SiC chip in the portion in which the concave portion is provided is 200 μm. Therefore, features unique to SiC are not exhibited. The reason is that, when the depth of the concave portion increases and the thickness of the SiC chip in the portion in which the concave portion is provided is reduced in order to reduce the on-resistance, the mechanical strength of the SiC chip is reduced and it is difficult to change a process.

The following Patent Document 3 discloses a semiconductor device which includes a front surface element structure that is provided on the front surface side of a SiC chip, a plurality of concave portions that are provided in the rear surface of the chip opposite to the front surface element structure, and a net-shaped support (hereinafter, referred to as a rib) that surrounds the bottoms of the concave portions and forms the side walls of the concave portions. In this example, the rib has a net shape in a plan view. Therefore, it is possible to reduce on-resistance using the plurality of concave portions which are provided in the rear surface of the chip opposite to one front surface element structure, while preventing the breaking of the SiC chip during a process.

In the following Patent Document 4, similarly to the following Patent Document 2 and Patent Document 3, a concave portion is provided in the rear surface opposite to a front surface element structure which is provided on the front surface side of a SiC chip. According to this structure, it is possible to maintain the mechanical strength of the SiC chip and to reduce on-resistance. In this example, a rear surface metal electrode which is provided in the concave portion formed in the rear surface of the chip contributes to maintaining the mechanical strength of the SiC chip. The rear surface structure of the semiconductor chip according to the related art will be described with reference to FIG. 13. FIG. 13 is a diagram illustrating the rear surface structure of the semiconductor device according to the related art. FIG. 13(A) is a perspective view illustrating the rear surface structure of a semiconductor chip 100 as viewed from the rear surface, FIG. 13(B) is a cross-sectional view taken along the line C-C' of FIG. 13(A), and FIG. 13(C) is a cross-sectional view taken along the line D-D' of FIG. 13(A).

In FIG. 13, a rib 101 which has a predetermined width from the outer circumference of the semiconductor chip 100 is provided in an outer circumferential portion of the rear surface of the semiconductor chip 100. Here, the thickness x of the rib 101 may be equal to or greater than 30 μm, preferably, equal to or greater than 50 μm, in order to provide the rib 101 and to maintain the mechanical strength of the semiconductor chip 100. The thickness y of a central portion of the chip in which a front surface element structure 102 is provided may be equal to or less than 20 μm, in terms of a design breakdown voltage. Therefore, in a concave portion 103 which is provided in the rear surface of the semiconductor chip 100, a level difference z between the outer circumferential portion of the chip in which the rib 101 is provided and the central portion of the chip in which the front surface element structure 102 is provided is equal to or greater than 30 μm.

In general, the thickness of the rear surface metal electrode is about a few micrometers and a sufficient electrical effect is obtained. Therefore, the rear surface metal electrode is formed along the inner wall of the concave portion and has a shape which traces the concave portion.

CITATION LIST

Patent Document

Patent Document 1: JP 9-102604 A
Patent Document 2: JP 2003-303966 A
Patent Document 3: JP 2006-156658 A
Patent Document 4: JP 2007-243080 A In the semiconductor chip 100 illustrated in FIG. 13, no problem occurs in a wafer process. However, when the semiconductor chip 100 is mounted on a base substrate, such as a ceramic substrate, by soldering, the amount of solder filled in the concave portion 103 is insufficient with respect to the volume of the concave portion 103. When the amount of solder is too large, a void is generated in the concave portion 103. This example will be described with reference to FIG. 14. FIG. 14 is a cross-sectional view illustrating the state of the semiconductor chip illustrated in FIG. 13 after mounting. FIGS. 14(A) and 14(B) illustrate a case in which the amount of solder 200 filled in the concave portion 103 is insufficient and FIG. 14(C) illustrate a case in which the amount of solder 200 filled in the concave portion 103 is too large.

In FIGS. 14(A) and 14(B), the rear surface of the semiconductor chip 100 is bonded to a copper (Cu) pattern (not illustrated) of a base substrate 300 through the solder 200. When the amount of solder 200 filled in the concave portion 103 is insufficient with respect to the volume of the concave portion 103, a void 210 is generated between the bottom of the concave portion 103 and the solder 200 in the stage in which the molten solder 200 is solidified, or a void 220 is generated between the solder 200 and the corners of the bottom of the concave portion 103. The voids 210 and 220 have the same properties as air and have a significantly lower thermal conductivity than the solder 200 around the voids 210 and 220 or the semiconductor chip 100. Therefore, the voids 210 and 220 hinder heat transfer from the semiconductor chip 100 to the solder 200. When heat generated during an electrical connection operation is accumulated in the chip 100 and the amount of accumulated heat is equal to or more than a design condition, there is a concern that the element will be damaged.

On the other hand, when the amount of solder 200 filled in the concave portion 103 is too large with respect to the volume of the concave portion 103 as illustrated in FIG. 14(C), the solder 200 protrudes from the outer circumference of the semiconductor chip 100 to the outside in the stage in which the molten solder 200 is solidified. Since the rib 101 has a small thickness x of 50 μm, the solder 200 which protrudes from the outer circumference of the semiconductor chip 100 wets to the front surface of the chip by a distance corresponding to the thickness of the semiconductor chip 100 and reaches a metal electrode (not illustrated) on the front surface of the semiconductor chip 100 (wetting of solder 230), which results in a defect. However, it is difficult to equalize the amount of solder 200 filled in the concave portion 103 to the volume of the concave portion 103.

In order to solve the above-mentioned problems, as in the above-mentioned Patent Document 4, the concave portion 103 provided in the rear surface of the chip can be filled with the rear surface metal electrode. As such, when the thick metal film is formed in order to fill in a level difference of several tens of micrometers between the outer circumferential portion of the chip and the central portion of the chip, the lead time and costs increase, which is not preferable. In addition, there is a concern that the semiconductor chip 100 will be cracked due to the thermal expansion of the thick metal film.

The invention has been made in view of the above-mentioned problems. In order to solve the above-mentioned problems of the related art, an object of the invention is to provide a semiconductor device which can be reliably soldered to an electrode that is provided in a concave portion of the rear surface opposite to a front surface element structure, without generating a defect due to a void or the wetting of solder.

SUMMARY

In order to solve the above-mentioned problems and achieve the object of the invention, a semiconductor device according to an aspect of the invention has the following characteristics. An element structure for making a current flow in a thickness direction of a semiconductor substrate is provided on a front surface of the semiconductor substrate. A concave portion is provided in a rear surface of the semiconductor substrate opposite to the element structure. A rib that forms a side wall of the concave portion is provided in the outer circumference of the concave portion. The rib has a larger thickness than a portion of the semiconductor substrate in which the concave portion is formed. A plurality of grooves that traverse the rib from the inner circumference to the outer circumference of the rib are provided in the rib.

In the semiconductor device according to the above-mentioned aspect of the invention, the rib may have at least one set of opposite sides, and a traverse direction of the groove which is provided in one of the opposite sides of the rib and a traverse direction of the groove which is provided in the other side may not be aligned on the same straight line.

In the semiconductor device according to the above-mentioned aspect of the invention, the depth of the groove may be less than the depth of the concave portion.

In the semiconductor device according to the above-mentioned aspect of the invention, the depth of the groove may be equal to the depth of the concave portion.

In the semiconductor device according to the above-mentioned aspect of the invention, the outer circumference of the semiconductor substrate may have a rectangular shape.

In the semiconductor device according to the above-mentioned aspect of the invention, the outer circumference of the rib may have the same shape as the outer circumference of the semiconductor substrate and may have a polygonal shape having at least two sets of opposite sides. The groove may be provided in each side of the rib or in a portion including each corner of the inner circumference of the rib or each corner of the outer circumference of the rib.

In the semiconductor device according to the above-mentioned aspect of the invention, the groove may be arranged at one end of each side of the rib.

In the semiconductor device according to the above-mentioned aspect of the invention, an outer circumferential portion of the front surface of the semiconductor substrate may be covered with a polyimide-based resin.

In the semiconductor device according to the above-mentioned aspect of the invention, the thickness of a portion of the semiconductor substrate in which the element structure is formed may be equal to or greater than 5 μm and equal to or less than 30 μm.

As such, according to the above-mentioned aspect of the invention, the grooves for air ventilation are provided in the rib which is formed in the rear surface of the semiconductor chip and air in the concave portion comes out of the grooves provided in the rib when solder is melted. Therefore, solder is uniformly spread to the entire concave portion and it is possible to prevent a defect due to a void. In this case, since the traverse directions of the opposite grooves of the rib deviate from each other on the same straight line, it is possible to minimize a reduction in the mechanical strength of the semiconductor chip due to the grooves.

According to the semiconductor device of the invention, it is possible to reliably solder a semiconductor chip, without preventing the occurrence of a defect due to a void or a defect due to the wetting-up of solder.

DETAILED DESCRIPTION

Figure 1:
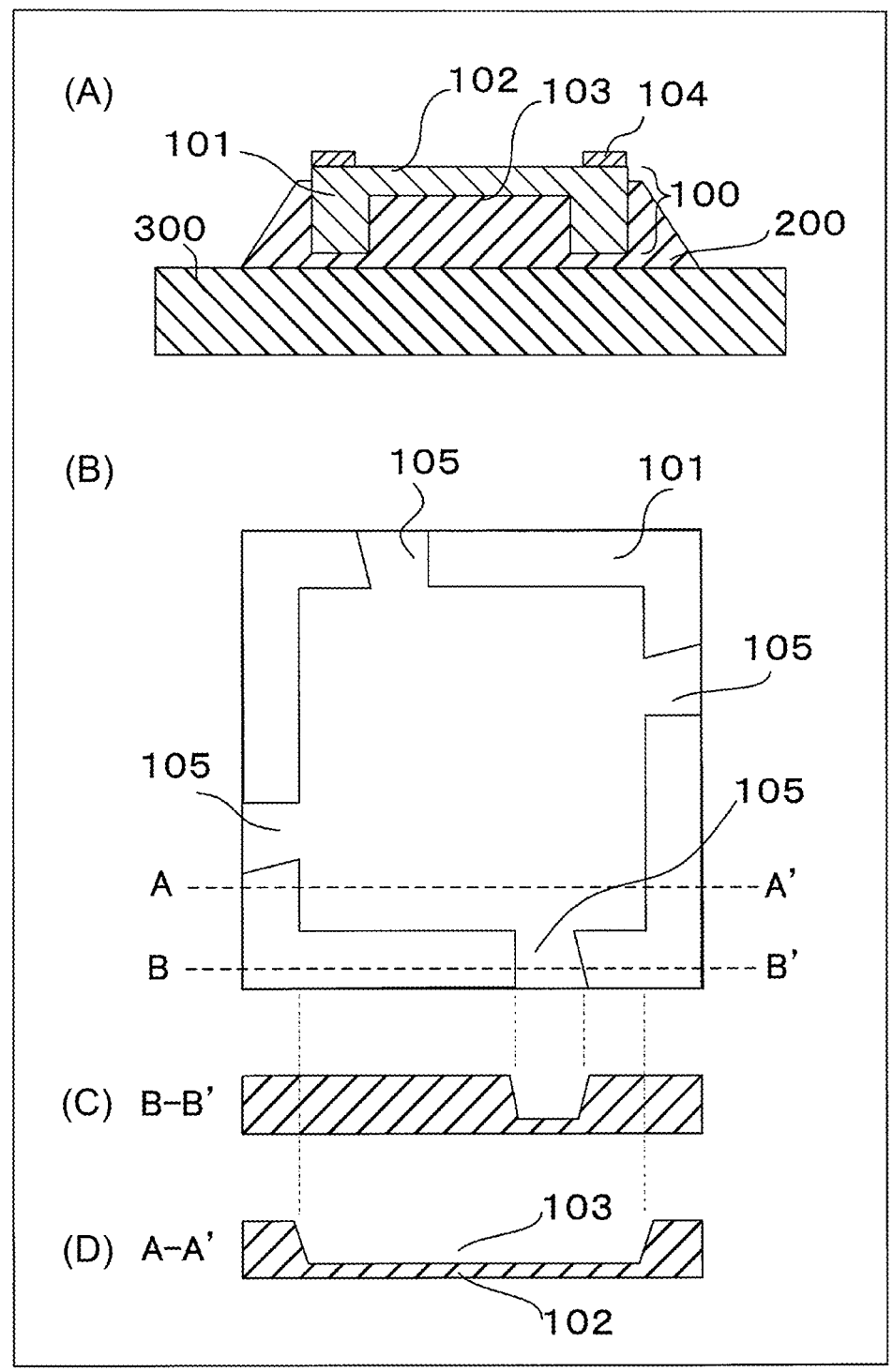
FIG. 1 is a diagram illustrating the structure of a semiconductor device according to Embodiment 1 of the invention.

Hereinafter, various non-limiting embodiments of a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. The invention is not limited to the following embodiments as long as it does not depart from the scope and spirit thereof.

Embodiment 1

FIG. 1 is a diagram illustrating the structure of a semiconductor device according to Embodiment 1 of the invention. FIG. 1(A) is a cross-sectional view and FIG. 1(B) is a plan view illustrating a semiconductor chip, as viewed from a rear surface. FIG. 1(C) is a cross-sectional view taken along the line B-B' of FIG. 1(B) and FIG. 1(D) is a cross-sectional view taken along the line A-A' of FIG. 1(B). In Embodiment 1, a SiC substrate (semiconductor chip) 100 obtained by forming a SiC epitaxial layer on a bulk substrate (hereinafter, referred to as a bulk SiC substrate) made of silicon carbide (SiC) is used and a front surface element structure 102 of a MOSFET is formed on a front surface, which is a surface close to the SiC epitaxial layer, of the chip. The bulk SiC substrate and the SiC epitaxial layer are an n type.

Specifically, the MOS gate (metal-oxide film-semiconductor insulated gate)-type front surface element structure 102 in which an $n^-$ drift layer, a $p^+$ base region, a p-type epitaxial region, an n-type J-FET region, an $n^+$ source region, a $p^+$ collector region, a gate insulating film, a gate electrode, an interlayer insulating film, and a source electrode are formed by a semiconductor device manufacturing method according to Embodiment 1, which will be described below, is formed on the SiC epitaxial layer on the front surface of the semiconductor chip 100. The bulk SiC substrate is processed and a concave portion 103 is formed in a region of the rear surface of the semiconductor chip 100 which is opposite to the front surface element structure 102 (a region opposite to the region of the front surface of the chip in which the front surface element structure 102 is provided). In this way, a rib 101 with a substantially rectangular ring shape which has a large thickness in a predetermined width range from the outer circumference of the chip is formed.

A groove 105 is provided in each side of the rib 101. The groove 105 traverses each side of the rib 101 from the inner circumference to the outer circumference and passes through each side. In addition, the grooves 105 are arranged in the rear surface of the chip such that the grooves 105 which are provided in opposite sides of the rib 101 are not arranged on the same straight line in the traverse direction of the grooves 105 (the direction perpendicular to the side of the rib 101), that is, the grooves 105 do not face each other. The reason is that, when the grooves 105 provided in opposite sides of the rib 101 are arranged on the same straight line in the traverse direction of the groove 105, the directions in which stress is applied are aligned with each other in the grooves, the mechanical strength of the semiconductor chip 100 is reduced, and the semiconductor chip 100 is likely to be broken.

When the concave portion 103 reaches the $n^-$ drift layer, an $n^+$ collector layer, which will be described below, is formed from the bottom of the rib 101 to the inner wall of the concave portion 103 after the rib 101 is formed, in order to reduce contact resistance with a drain electrode. Then, the drain electrode, which is a metal film, is formed on the surface of the n⁺ collector layer. In the element according to this embodiment, the mechanical strength of the semiconductor chip 100 is maintained by the rib 101 and the thickness of a portion of the semiconductor chip 100 in which the front surface element structure 102 is formed is reduced by the concave portion 103. Therefore, it is possible to reduce on-resistance.

An outer circumferential portion of the front surface of the semiconductor chip 100 is covered with a polyimide-based resin as an outer circumference protective film 104 and prevents the wetting of solder to the front surface of the chip when the semiconductor chip 100 is mounted to a base substrate 300 by solder 200. In Embodiment 1, the semiconductor chip 100 has a square shape with a size (chip size) in which one side is 3 mm and the rib 101 provided in the rear surface of the chip has a width of 0.5 mm. The groove 105 is 0.3 mm away from the inside of the corner of the rib 101. The width of the groove 105 is 0.3 mm. The width of the groove 105 means the opening width of the groove 105 in a direction perpendicular to the direction in which the groove 105 traverses (passes through) the side of the rib 101 from the inner circumference to the outer circumference.

In Embodiment 1, the groove 105 is formed in each side of the rib 101. This structure has the effect of stabilizing the semiconductor chip 100 when the semiconductor chip 100 is mounted on the base substrate 300. That is, with a reduction in the thickness of the semiconductor chip 100, the weight of the semiconductor chip 100 is reduced. In this case, when the solder 200 is melted, there is a concern that the position of the semiconductor chip 100 which is lightened with a reduction in thickness will deviate from the base substrate 300. Specifically, when the grooves 105 are not formed in all sides of the rib 101, the amount of solder 200 which flows to the outside of the concave portion 103 through the grooves 105 varies depending on the position of the grooves 105. Therefore, the shape of the end of the solder 200 which flows to the outside of the concave portion 103 through the grooves 105 is asymmetric with respect to the semiconductor chip 100. In this case, the semiconductor chip 100 is inclined in the direction in which a small amount of solder 200 flows, the semiconductor chip 100 rotates about the side of the rib 101 in which the groove 105 is not formed, or the semiconductor chip 100 moves to the side of the rib 101 in which the groove 105 is not formed. In contrast, when the grooves 105 are formed in all sides of the rib 101, substantially the same amount of solder 200 flows to the outside of the concave portion 103 through the grooves 105. Therefore, the shape of the end of the solder 200 which flows to the outside of the concave portion 103 through the grooves 105 is symmetric with respect to the semiconductor chip 100. As a result, the semiconductor chip 100 on the solder 200 is stabilized and no problem occurs in a mounting operation.

The position of the groove 105 deviates from the center line of the semiconductor chip 100 and the grooves 105 provided in opposite sides of the rib 101 are not arranged on the same straight line. In this structure, when the solder 200 is discharged to the outside of the concave portion 103 through the grooves 105, there is a concern that the side surface of the rib 101 in the vicinity of the corner will be pressed by the discharged solder 200 in a first direction opposite to the discharge direction of the solder 200 and the semiconductor chip 100 will rotate. The rotation of the semiconductor chip 100 can be suppressed by an external mechanical means. In Embodiment 1, one side wall of the groove 105 which is close to the corner of the rib 101 is inclined toward the corner of the rib 101 with respect to the other side wall such that the width of the groove 105 on the outer circumferential side of the rib 101 is 0.2 mm greater than that on the inner circumferential side and increases from the inside to the outside. The width of the groove 105 increases from the inside to the outside and the corner of the rib 101 is covered with the discharged solder 200. Therefore, a side wall which is perpendicular to the side surface that receives force caused by the solder 200 in the first direction in the vicinity of the corner of the rib 101 is pressed in a second direction perpendicular to the first direction and the rotation of the semiconductor chip 100 is suppressed. As such, measures to apply force to reversely rotate the semiconductor chip 100 (rotate the semiconductor chip 100 in a direction opposite to the rotation direction of the semiconductor chip 100 when the solder 200 is discharged to the outside of the concave portion 103 through the groove 105) are taken.

The thickness of a portion of the semiconductor chip 100 in which the front surface element structure 102 is formed may be equal to or greater than 5 μm and equal to or less than 30 μm. The reason is as follows. When the thickness of the portion of the semiconductor chip 100 in which the front surface element structure 102 is formed is less than 5 μm, the mechanical strength of the semiconductor chip 100 is reduced and there is a high risk of breakdown during a process. On the other hand, when the thickness of the portion of the semiconductor chip 100 in which the front surface element structure 102 is formed is greater than 30 μm, the on-resistance increases and a desired element performance is not obtained.

The thickness of the semiconductor chip 100 in the outer circumferential portion of the chip in which the rib 101 is formed may be equal to or greater than 50 μm and equal to or less than 100 μm. The reason is as follows. When the thickness of the semiconductor chip 100 in the outer circumferential portion of the chip in which the rib 101 is formed is less than 50 μm, the mechanical strength of the semiconductor chip 100 is reduced and there is a high risk of breakdown during a process. On the other hand, when the thickness of the semiconductor chip 100 in the outer circumferential portion of the chip in which the rib 101 is formed is greater than 100 μm, a level difference from the concave portion 103 is too large and the lead time of a process of forming the concave portion 103 increases or costs increase.

The width of the rib 101 may be equal to or greater than 50 μm and equal to or less than 1000 μm. The reason is as follows. When the width of the rib 101 is less than 50 μm, the mechanical strength of the semiconductor chip 100 is reduced and there is a high risk of breakdown during a process. On the other hand, when the width of the rib 101 is greater than 1000 μm, the area of the concave portion 103 is reduced and the on-resistance increases.

Figure 2:
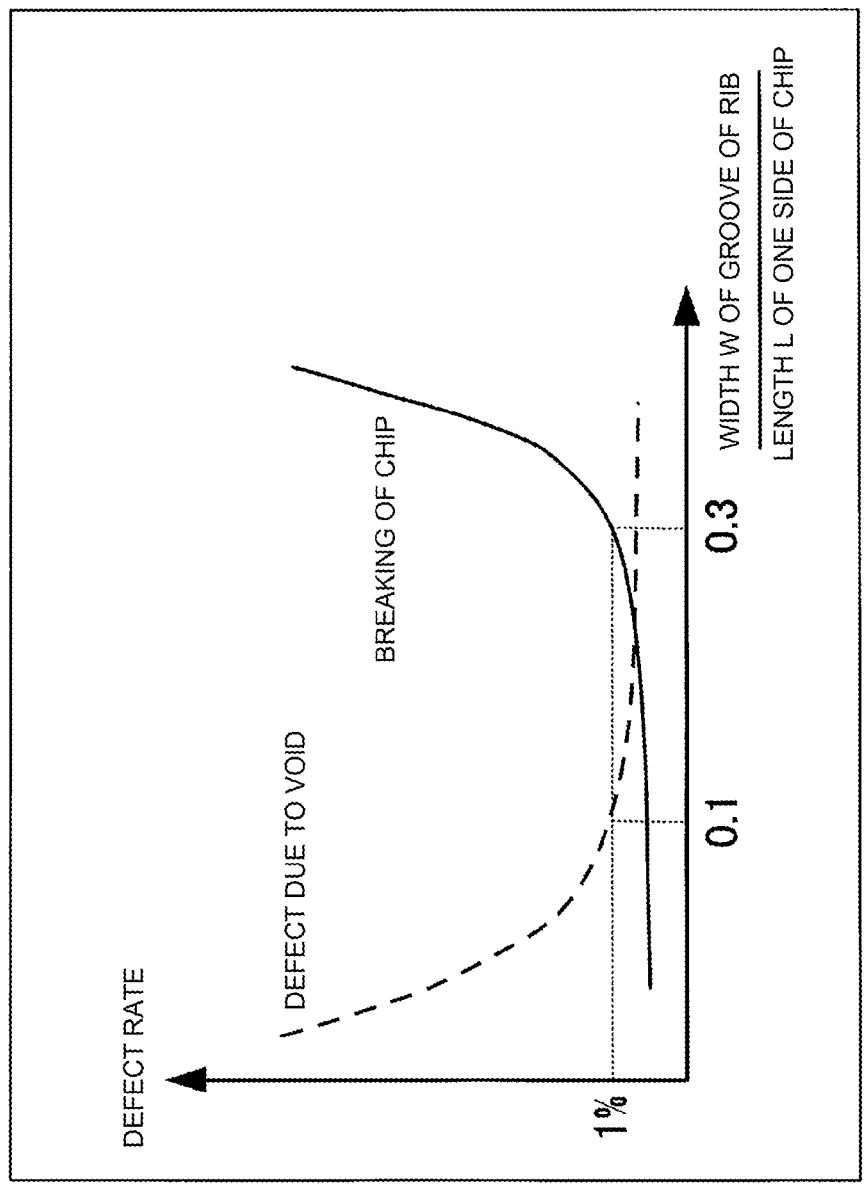
FIG. 2 is a characteristic diagram illustrating the relationship between a defect rate and the ratio of the width W of a groove of a rib to the length L of one side of a semiconductor chip.

The ratio W/L of the width W of the groove 105 of the rib 101 to the length L of one side of the semiconductor chip 100 may be equal to or greater than 0.1 and equal to or less than 0.3 (FIG. 2). The reason is as follows. FIG. 2 is a characteristic diagram illustrating the relationship between a defect rate and the ratio of the width W of the groove of the rib to the length L of one side of the semiconductor chip. As illustrated in FIG. 2, when the value of W/L is less than 0.1, the fluidity of the solder 200 is reduced and a defect caused by a void occurs. On the other hand, when the value of W/L is greater than 0.3, the mechanical strength of the semiconductor chip 100 is reduced and the semiconductor chip 100 is broken during a process.

The depth of the groove 105 of the rib 101 may be in the range of 50% to 100% of the depth of the concave portion 103 in the rear surface of the chip. The reason is as follows. When the depth of the groove 105 is greater than 100% of the depth of the concave portion 103 and is greater than the depth of the concave portion 103, the mechanical strength of the semiconductor chip 100 is reduced and there is a concern that the semiconductor chip 100 will be broken during a process. On the other hand, when the depth of the groove 105 is less than 50% of the depth of the concave portion 103, the groove 105 does not function as an air vent during soldering.

In FIG. 1(A), the semiconductor chip 100 is mounted on the base substrate 300 through the solder 200. Then, heating is performed in a processing furnace while increasing the temperature to melt the solder 200. In this case, the molten solder 200 flows from the inside to the outside of the rib 101 or from the outside to the inside of the rib 101 through the grooves 105 of the rib 101. Therefore, it is possible to solidify the solder 200 with an optimum thickness, without a void remaining in the concave portion 103. As a result, the mounting of the semiconductor chip 100 is completed, without the positional deviation of the semiconductor chip 100.

As such, when the grooves 105 for air ventilation are provided in the rib 101 formed in the rear surface of the semiconductor chip 100, it is possible to mount the semiconductor chip 100 to a module, without any defect in the drain electrode of the concave portion 103 due to a void. Therefore, heat transfer from the semiconductor chip 100 is improved and it is possible to increase the lifespan of the semiconductor device. In addition, the outer circumferential portion of the chip is covered with a polyimide-based resin serving as the outer circumference protective film 104. Therefore, even when the solder 200 wets to the front surface of the chip, it does not reach the front surface of the chip. As a result, it is possible to prevent a defect caused by the wetting of the solder 200.

Figure 3:
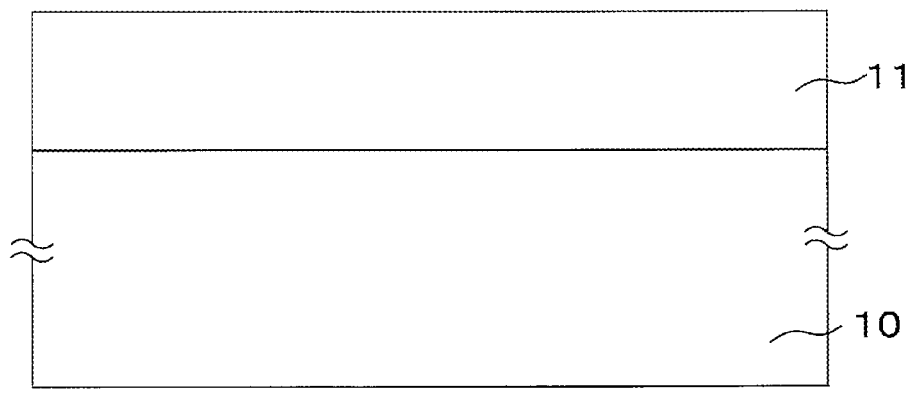
FIG. 3 is a cross-sectional view (part 1) schematically illustrating a process of manufacturing a MOSFET according to Embodiment 1 of the invention.

FIGS. 3 to 6 are cross-sectional views schematically illustrating a process of manufacturing the MOSFET according to Embodiment 1 of the invention. Hereinafter, the process of manufacturing the semiconductor device according to Embodiment 1 will be described. In the manufacturing process, a vertical MOSFET having SiC as a main material was manufactured (produced) using an n-type substrate. First, a 4H—SiC substrate which has a diameter of 150 mm and a thickness of 300 µm, is an n type, and has a (0001) Si plane as the front surface is prepared as an n-type substrate 10. Then, an n⁻ drift layer 11 was epitaxially grown on the front surface of the n-type substrate 10 by a chemical vapor deposition (CVD) method (FIG. 3).

In the epitaxial growth of a SiC film which will be the n⁻ drift layer 11, silane ($SiH_4$) gas is used as a silicon material and propane ($C_3H_8$) gas is used as a carbon material. The impurity concentration of the n drift layer 11 was $1.8 \times 10^{-16}$ $cm^{-3}$. As such, a SiC epitaxial substrate in which the n⁻ drift layer 11 was formed on the n-type substrate 10 was formed. A surface of the SiC epitaxial substrate close to the n⁻ drift layer 11 was a front surface of a substrate and a surface of the SiC epitaxial substrate close to the n-type substrate 10 was a rear surface of the substrate.

Then, an ion implantation mask (not illustrated) with a predetermined pattern was formed on the surface of the n⁻ drift layer 11 (the front surface of the substrate) by photo-lithography. Then, aluminum (Al) ions were implanted with a dose of about $1 \times 10^{16}$ $cm^{-2}$ at a substrate temperature of 600° C. using the ion implantation mask as a mask (high-temperature ion implantation). Then, the ion implantation mask was removed and a p⁺ base region 12 was selectively formed in a surface layer of the surface of the n⁻ drift layer 11 close to the front surface of the substrate in an active region 40.

Figure 4:
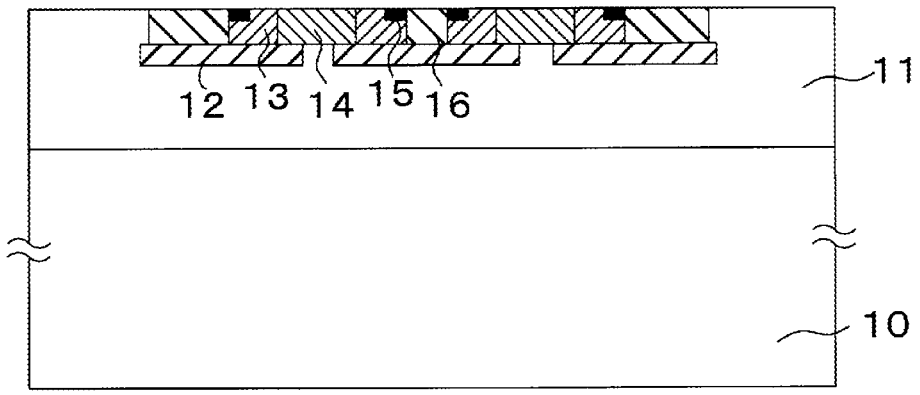
FIG. 4 is a cross-sectional view (part 2) schematically illustrating the process of manufacturing the MOSFET according to Embodiment 1 of the invention.

Then, a p-type SiC film with an impurity concentration of $5 \times 10^{16}$ $cm^{-3}$ was epitaxially grown on the entire surface of the n⁻ drift layer 11 so as to cover the p⁺ base region 12, thereby forming a p-type epitaxial region 13. At that time, the thickness of the SiC epitaxial substrate is the sum of the thickness of the n-type substrate 10, the thickness of the n⁻ drift layer 11, and the thickness of the p-type epitaxial region 13. In addition, the p-type epitaxial region 13 in a breakdown voltage structure region was removed by dry etching. An n-type J-FET region 14, an n⁺ source region 15, and a p⁺ collector region 16 were formed in predetermined regions of the p-type epitaxial region 13 by a photolithography process and a high-temperature ion implantation process (FIG. 4). A p-type JTE region was formed as a breakdown voltage region in the outer circumference of the chip so as to surround the MOSFET region (not illustrated). Ion implantation for forming the n-type J-FET region 14 and the p⁺ collector region 16 was performed, while acceleration energy was changed from 40 keV to 460 keV, such that ion species reached a deep region.

Then, a rapid heat treatment process was performed at a temperature of 1700° C. for 2 minutes to activate the ions. Then, a heat treatment was performed in an oxidation atmosphere to thermally oxidize a silicon portion, thereby forming a gate insulating film 17 with a thickness of 70 nm so as to cover the p-type epitaxial region 13, the n-type J-FET region 14, and the n⁺ source region 15. Then, a gate electrode 18 was formed on a gate insulating film 17 to form a MOS gate portion of a front surface element structure. The gate electrode 18 is a high-impurity-concentration polysilicon film with a thickness of 0.5 µm which is formed by the CVD and is processed to a desired pattern by a photolithography process and an etching process.

Figure 5:
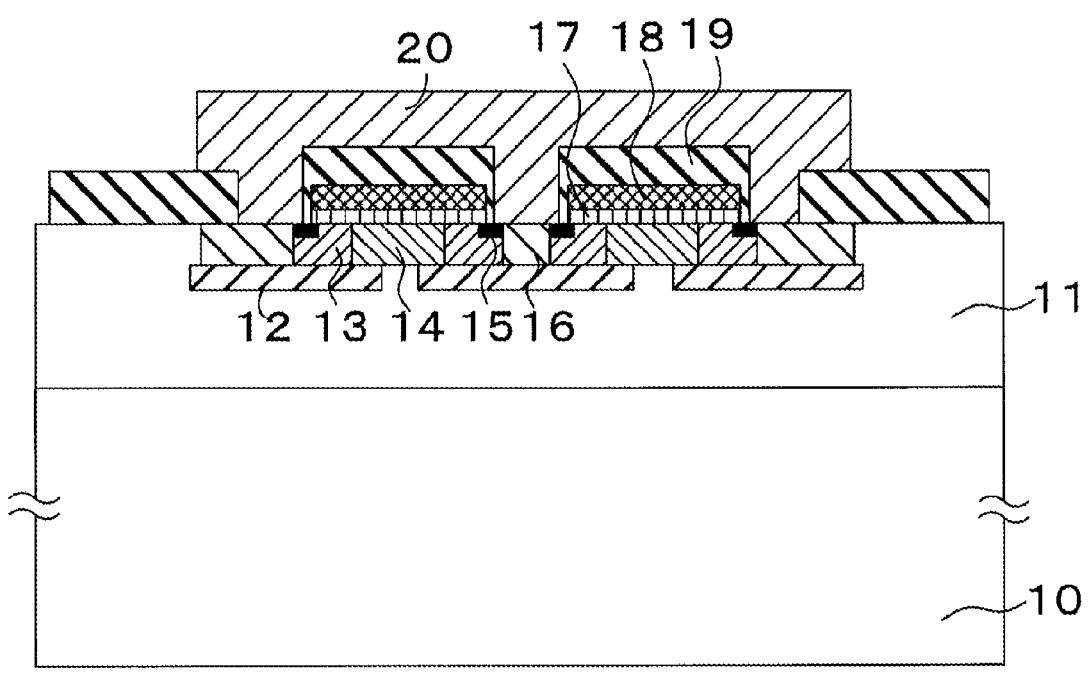
FIG. 5 is a cross-sectional view (part 3) schematically illustrating the process of manufacturing the MOSFET according to Embodiment 1 of the invention.

Then, boro-phospho-silicate glass (BPSG) with a thickness of 1 µm was formed as an interlayer insulating film 19 by the CVD method and was patterned in a desired shape by the photolithography process and an etching process. Then, a laminated film of a nickel (Ni) film and a titanium (Ti) film was formed as a source electrode 20 on the surface of the n⁺ source region 15 and the surface of the p⁺ collector region 16 so as to come into ohmic contact therewith (FIG. 5).

Then, a silicon nitride (SiN) film with a thickness of 1 µm was formed as a protective film (not illustrated), which was arranged on the front surface side of the substrate, by the CVD method. The protective film was patterned in a predetermined shape. In this way, the front surface element structure was completed. In Embodiment 1, the silicon nitride film is used as the protective film. However, the silicon nitride film is not necessarily used as the protective film. Any insulating film may be used as the protective film. For example, an organic material film, such as a polyimide film, a silicon dioxide ($SiO_2$) film, or an amorphous carbon film can be used as the silicon nitride film.

Then, the front surface of the substrate on which the front surface element structure was formed was attached to a supporting substrate (not illustrated) and the rear surface of the n-type substrate 10 was ground such that the thickness of the n-type substrate 10 was reduced to 50 µm. In Embodiment 1, since the thickness of the n-type substrate 10 before grinding is 300 μm, a rear surface grinding process is performed in order to reduce the time required for a trench etching process which is performed for the rear surface of the substrate after the rear surface is ground. Therefore, when the thickness of the n-type substrate 10 before grinding is sufficiently small, for example, is close to 50 μm, the rear surface grinding process may be omitted.

Then, a Ni film was deposited with a thickness of about 1 μm on the ground surface of the n-type substrate 10. Portions of the Ni film in a concave portion forming region (a region opposite the front surface element structure) in the central portion of the element and a groove forming region in the outer circumferential portion of the element were removed by a photolithography process and an etching process. The central portion of the element is a central portion (active region 40) of the semiconductor chip which is obtained by dicing, which will be described below, and the outer circumferential portion of the element is an outer circumferential portion (breakdown voltage structure portion 30) of the semiconductor chip which surrounds the active region 40. Then, trench etching was performed for the rear surface of the substrate using the remaining portion of the Ni film as an etching mask to form a concave portion in the central portion of the element of the n-type substrate 10. In this way, the outer circumferential portion of the element remained as the rib and the grooves were formed in a part of the outer circumferential portion of the element. In this case, the trench etching is performed such that the concave portion reaches the n$^-$ drift layer 11. Therefore, the n$^-$ drift layer 11 is exposed from the bottom of the trench groove. In this case, the thickness of the element central portion in which the front surface element structure was formed was about 20 μm and the level difference between the central portion of the element and the rib in the concave portion was about 30 μm.

Figure 6:
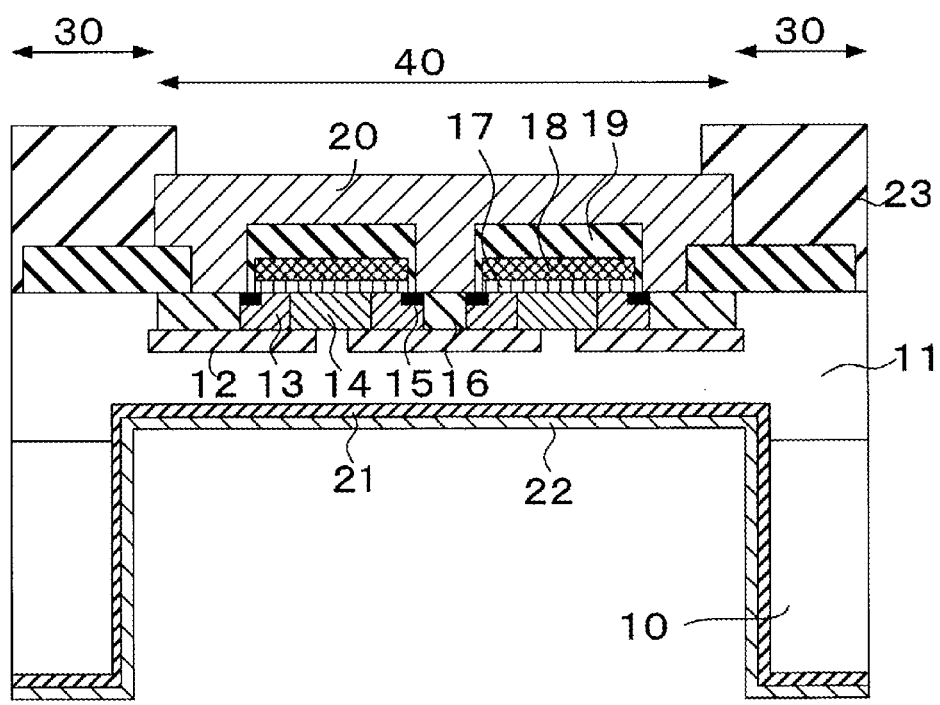
FIG. 6 is a cross-sectional view (part 4) schematically illustrating the process of manufacturing the MOSFET according to Embodiment 1 of the invention.

Then, the remaining portion of the Ni film and the oxide film on the outermost surface of the substrate were removed. Then, ions were implanted into the inner wall of the concave portion and a heat treatment was performed to form an n$^+$ collector layer 21 along the inner wall of the concave portion. Then, an Al film was formed as a drain electrode 22, which was a rear surface electrode, on the rear surface of the substrate and a heat treatment was performed. Since Embodiment 1 relates to a MOSFET device, the drain electrode 22 may be formed on at least the surface of the n$^+$ collector layer 21 and the rear surface of the n-type substrate 10 and is not necessarily formed on the side surface of the semiconductor chip. Then, the supporting substrate was peeled off from the front surface of the substrate and a polyimide-based resin was coated as an outer circumference protective film 23 on the outer circumferential portion of the element, which was arranged on the front surface side of the substrate, in the MOS gate portion. In this way, the element forming process was completed (FIG. 6).

Then, the SiC epitaxial substrate was diced into squares in which one side was 3 mm. In this way, a semiconductor chip with a desired size was obtained. In addition, a solder pellet which was made of a tin (Sn)-antimony (Sb)-based material was placed on a base substrate obtained by attaching a copper pattern to a ceramic layer (insulating layer), the divided semiconductor chip was placed on the solder pellet, and heating was performed at a temperature of 300° C. to electrically connect the rear surface electrode of the semiconductor chip and the base substrate using soldering. In addition, wiring lines were connected to the front surface of the semiconductor chip by wire bonding and the assembled body was sealed with a resin or was accommodated in a resin case. In this way, the semiconductor device according to Embodiment 1 was manufactured (not illustrated).

The bonding state of the interface between the solder and the inner wall of the concave portion in the manufactured semiconductor device according to Embodiment 1 was examined. As a result, a void was not found from the concave portion (for example, the interface between the solder and the inner wall of the concave portion) and the wetting of the solder was not found in visual inspection.

Embodiment 2

Figure 7:
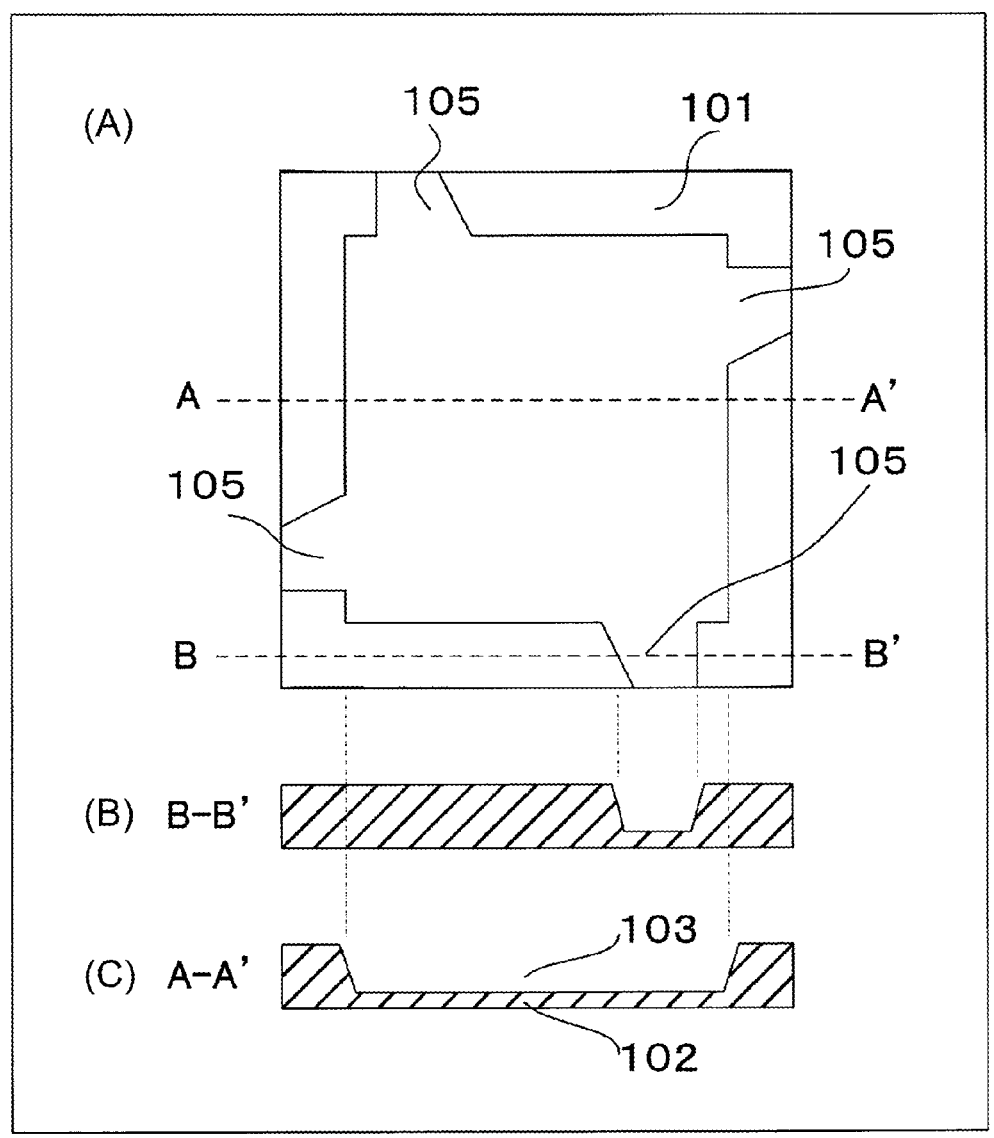
FIG. 7 is a diagram illustrating the structure of a semiconductor device according to Embodiment 2 of the invention.

In Embodiment 2, the shape of the groove of the rib in the rear surface of the chip according to Embodiment 1 is changed. FIG. 7 is a diagram illustrating the structure of a semiconductor device according to Embodiment 2 of the invention. FIG. 7(A) is a plan view illustrating a semiconductor chip as viewed from the rear surface. FIG. 7(B) is a cross-sectional view taken along the line B-B' of FIG. 7(A) and FIG. 7(C) is a cross-sectional view taken along the line A-A' of FIG. 7(A). In Embodiment 2, a groove 105 for suppressing the rotation of the semiconductor chip has the following shape: one side wall of the groove 105 which is away from the corner of a rib 101 is inclined with respect to the other side wall such that the width of the groove 105 on the inner circumferential side of the rib 101 is greater than that on the outer circumferential side and is reduced from the inside to the outside. When the chip on a solder pellet is heated, solder flows. The solder remaining in the concave portion which is provided in the rear surface of the chip moves to the outside over the rib and the grooves and the chip rotates. In general, since the movement of the chip is limited by, for example, a jig, positional deviation occurs in the chip in the rotation direction. In contrast, since the width of the groove 105 is reduced from the inside to the outside, measures to suppress the rotation of the semiconductor chip are taken.

Embodiment 3

Figure 8:
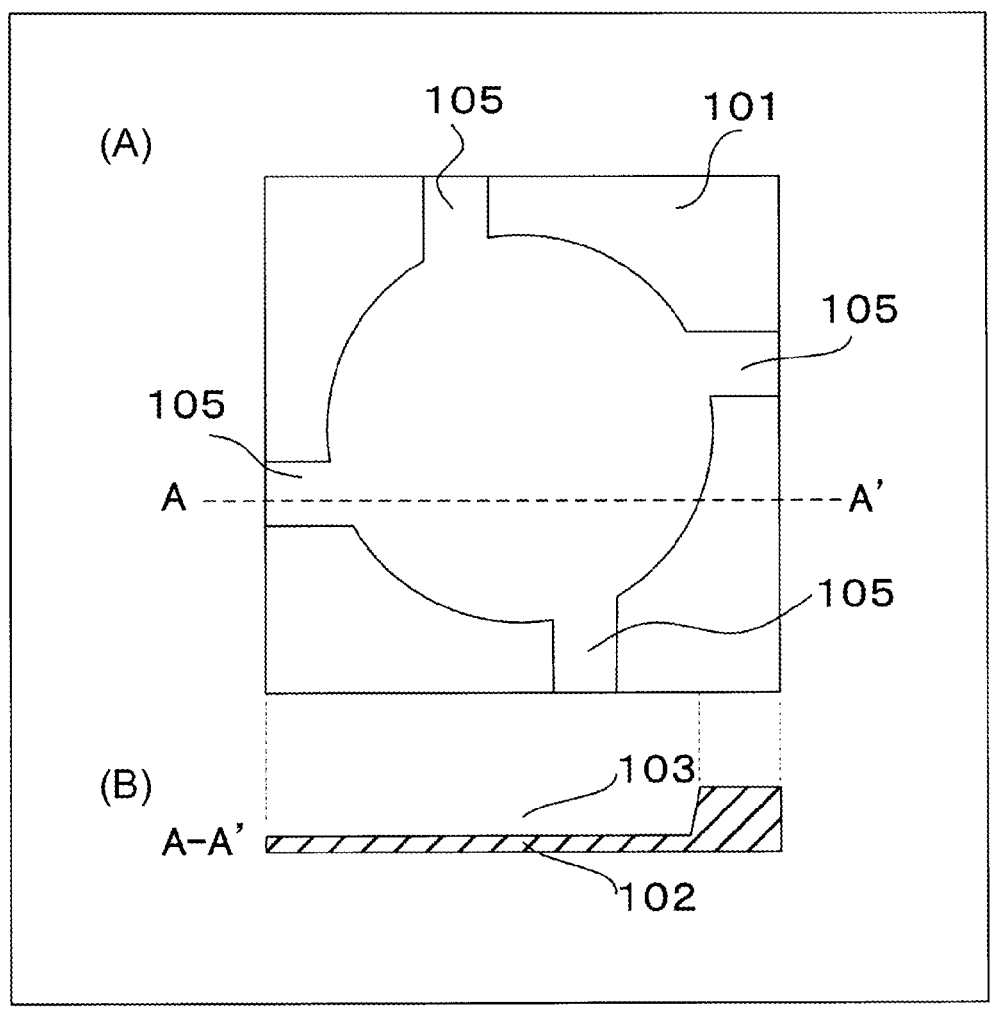
FIG. 8 is a diagram illustrating the structure of a semiconductor device according to Embodiment 3 of the invention.

In Embodiment 3, the planar shape of the concave portion provided in the rear surface of the chip according to Embodiment 1 is changed. FIG. 8 is a diagram illustrating the structure of a semiconductor device according to Embodiment 3 of the invention. FIG. 8(A) is a plan view illustrating a semiconductor chip as viewed from the rear surface and FIG. 8(B) is a cross-sectional view taken along the line A-A' of FIG. 8(A). In Embodiment 3, a concave portion 103 provided in the rear surface of the chip has a circular shape in a plan view such that a void is less likely to be generated in the concave portion 103. In this example, measures to suppress the rotation of the semiconductor chip are not taken in the groove 105. However, the shape of the groove 105 may be changed as in Embodiments 1 and 2 and measures to suppress the rotation of the semiconductor chip may be taken.

Embodiment 4

Figure 9:
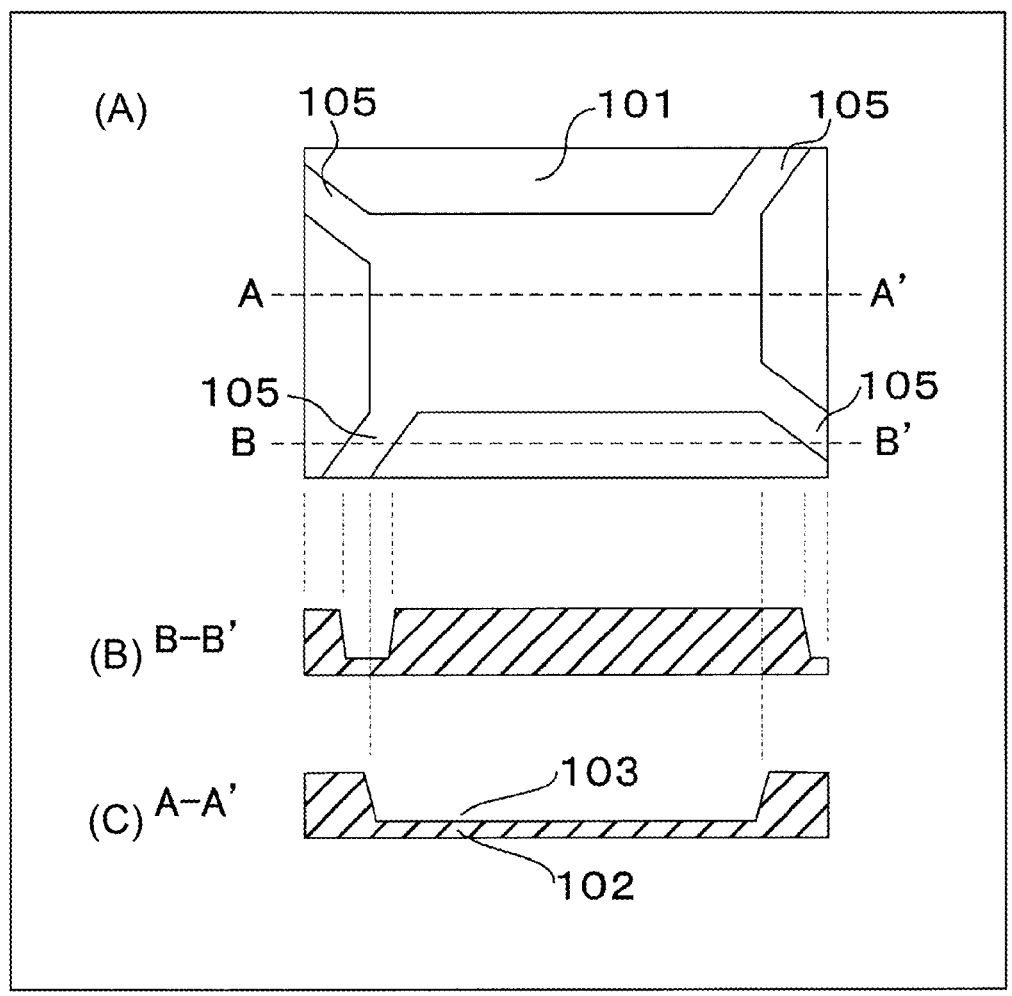
FIG. 9 is a diagram illustrating the structure of a semiconductor device according to Embodiment 4 of the invention.

In Embodiment 4, the shape of the chip, the planar shape of the concave portion provided in the rear surface of the chip, and the arrangement of the grooves in the rib in Embodiment 1 are changed. FIG. 9 is a diagram illustrating the structure of a semiconductor device according to Embodiment 4 of the invention. FIG. 9(A) is a plan view illustrating a semiconductor chip as viewed from the rear surface, FIG. 9(B) is a cross-sectional view taken along the line B-B' of FIG. 9(A), and FIG. 9(C) is a cross-sectional view taken along the line A-A' of FIG. 9(A). In Embodiment 4, the chip has a rectangular shape with a size of 2.5 mm×4 mm, the rib has a uniform width of 0.5 mm from the outer circumference of the chip, and a groove 105 with a width of 0.3 mm is provided at the end of each side of a rib 101.

The groove 105 traverses the side of the rib 101 from the inside to the outside and passes through the side such that the side wall thereof is inclined at a predetermined angle in a direction perpendicular to the side of the rib 101. The groove 105 may be provided at the corner of the rib 101. As such, when the chip has a rectangular shape, opposite grooves 105 are not arranged on the same straight line even when the groove 105 is provided at the end of each side of the rib 101 or at each corner of the rib 101. Therefore, it is possible to prevent a reduction in the mechanical strength of the semiconductor chip and a void is less likely to be generated. In Embodiment 4, the reason why the groove 105 which comes into contact with an outer circumferential portion of the chip deviates from the corner is that, when the groove 105 is provided at the corner, the angle formed between the side wall of the groove 105 and the side surface of the rib 101 is acute and a chipping failure (defect), such as the breaking of the corner of the rib 101, occurs in the dicing process. Since the groove 105 which comes into contact with the outer circumferential portion of the chip deviates from the corner, a chipping failure is less likely to occur in the dicing process.

In Embodiments 2, 3, and 4, a vertical MOSFET was manufactured by the same manufacturing process as that in Embodiment 1 and the bonding state of the interface between solder and the inner wall of the concave portion 103 was evaluated. As a result, in all of the embodiments, when the semiconductor chip was mounted on the base substrate, a void was not found from the concave portion 103 and the wetting of the solder was not found in visual inspection.

In all of Embodiments 2, 3, and 4, when solder was melted, the semiconductor chip hardly rotated and was stable. In particular, in Embodiment 3 in which the concave portion provided in the rear surface of the chip has a circular shape, there are no measures to suppress the rotation of the semiconductor chip. However, it is considered that, since the groove 105 is provided in the vicinity of the center of the side of the rib 101, force to rotate to the semiconductor chip is weak. Since the grooves 105 which are provided in opposite sides of the rib 101 are not arranged on the same straight line, it is possible to stably mount the semiconductor chip, without damaging the semiconductor chip, even when the semiconductor chip is electrically connected to the base substrate by soldering.

Embodiment 5

Figure 10:
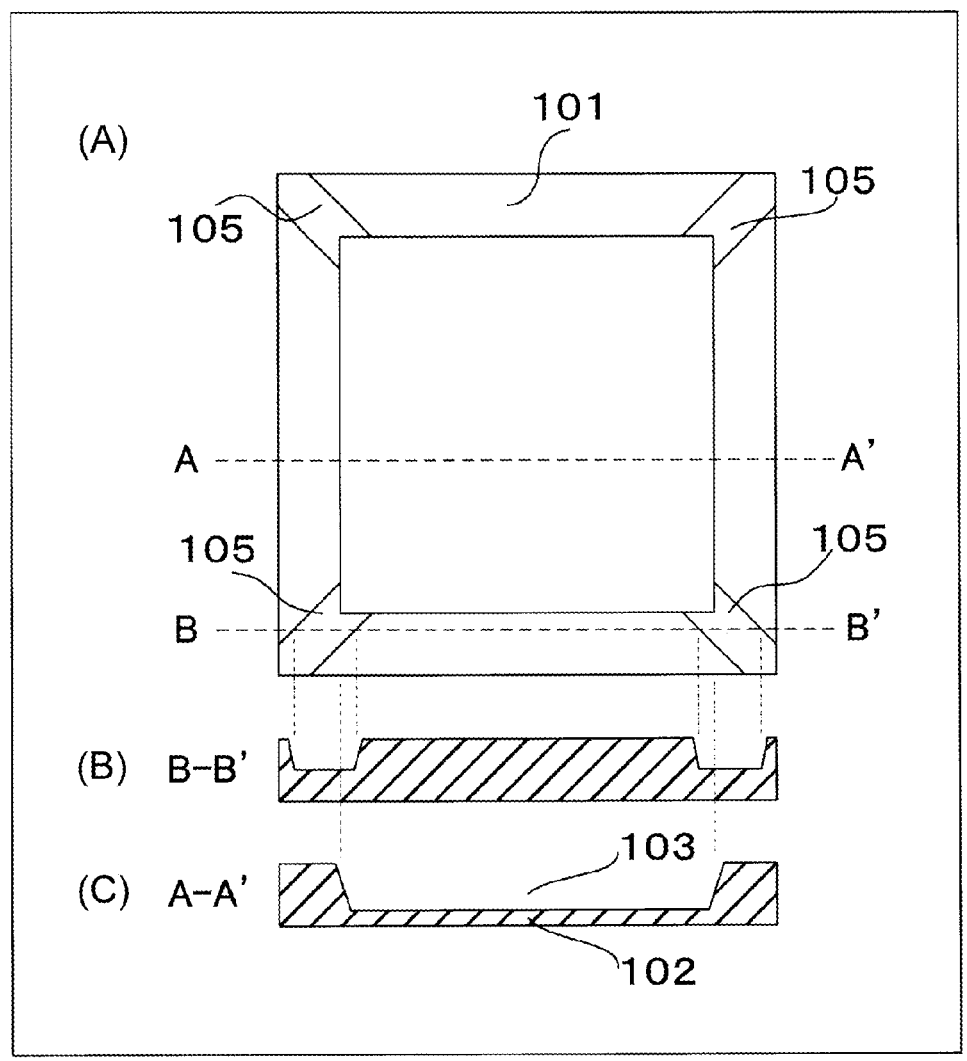
FIG. 10 is a diagram illustrating the structure of a semiconductor device according to Embodiment 5 of the invention.

In Embodiment 5, the depth of the groove in the rib in Embodiment 1 is changed. FIG. 10 is a diagram illustrating the structure of a semiconductor device according to Embodiment 5 of the invention. FIG. 10(A) is a plan view illustrating a semiconductor chip as viewed from the rear surface, FIG. 10(B) is a cross-sectional view taken along the line B-B' of FIG. 10(A), and FIG. 10(C) is a cross-sectional view taken along the line A-A' of FIG. 10(A). Embodiment 5 differs from Embodiments 1 to 4 in that a groove 105 for air ventilation is shallower than a concave portion 103 provided in the rear surface and a level difference between the groove 105 and the concave portion 103 is about 10 µm.

As such, since the groove 105 is shallow, the mechanical strength of the groove 105 is improved. Therefore, it is not necessary to provide the grooves 105 in opposite sides of a rib 101 so as to deviate from the same straight line and it is possible to ensure flexibility in the design. In Embodiment 5, a linear groove 105 is formed on a diagonal line of the corner of the semiconductor chip. When the groove 105 is provided at each corner of the rib 101, the center of each corner is not necessarily aligned with the center of the groove 105 and the groove 105 may partially overlap the center of the corner. In Embodiment 5, the chip may have a rectangular shape and the grooves 105 provided in opposite sides of the rib 101 may deviate from the same straight line. In this case, it is possible to further improve the mechanical strength of the semiconductor chip.

Embodiment 6

Figure 11:
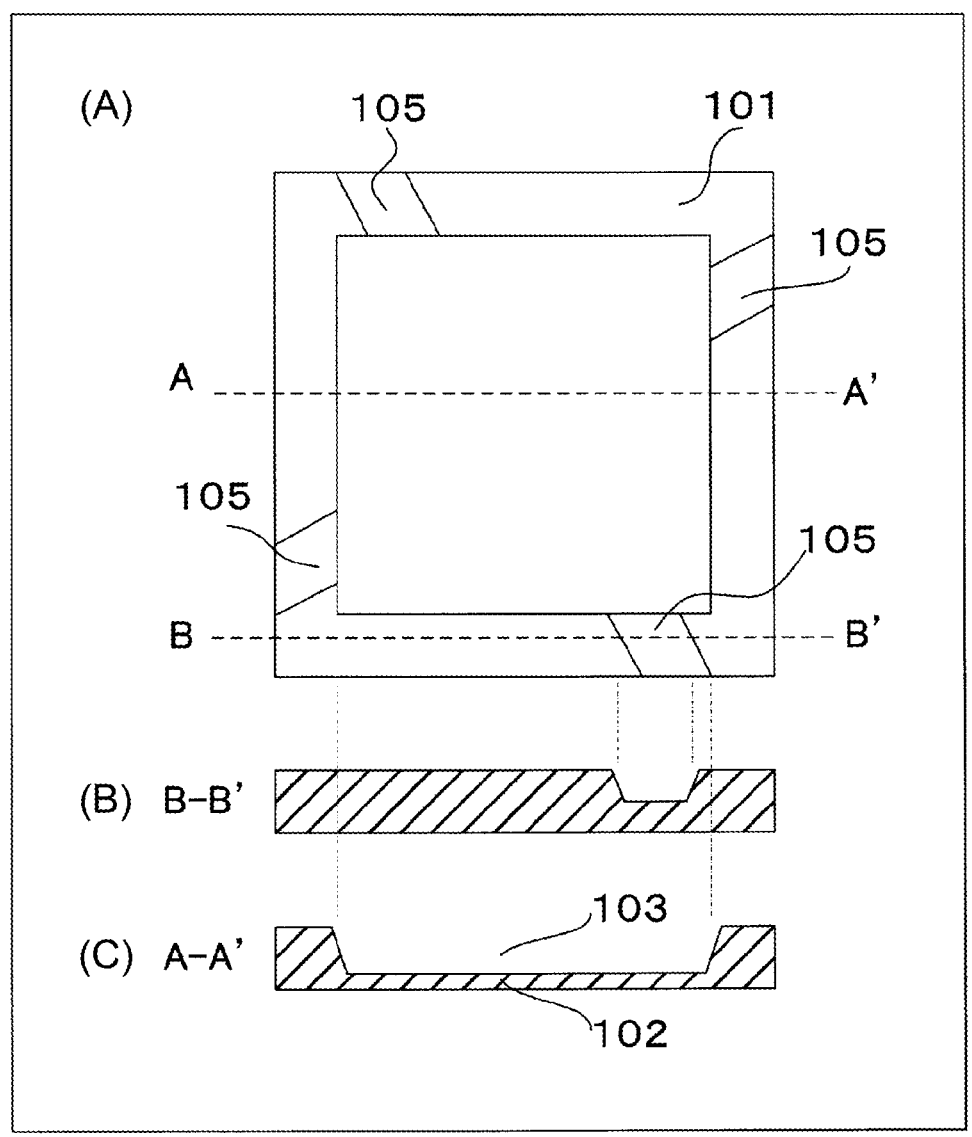
FIG. 11 is a diagram illustrating the structure of a semiconductor device according to Embodiment 6 of the invention.

In Embodiment 6, the shape of the groove in the rib according to Embodiment 5 is changed. Embodiment 6 is manufactured by the same method as Embodiment 5 except that the shape of the groove is changed. FIG. 11 is a diagram illustrating the structure of a semiconductor device according to Embodiment 6 of the invention. FIG. 11(A) is a plan view illustrating a semiconductor chip as viewed from the rear surface, FIG. 11(B) is a cross-sectional view taken along the line B-B' of FIG. 11(A), and FIG. 11(C) is a cross-sectional view taken along the line A-A' of FIG. 11(A). In Embodiment 6, as a groove for suppressing the rotation of the semiconductor chip, a groove 105 is provided close to one corner of each side of a rib 101 in the semiconductor chip and the extension direction of the groove 105 from the inside to the outside leans toward the near corner.

Embodiment 7

Figure 12:
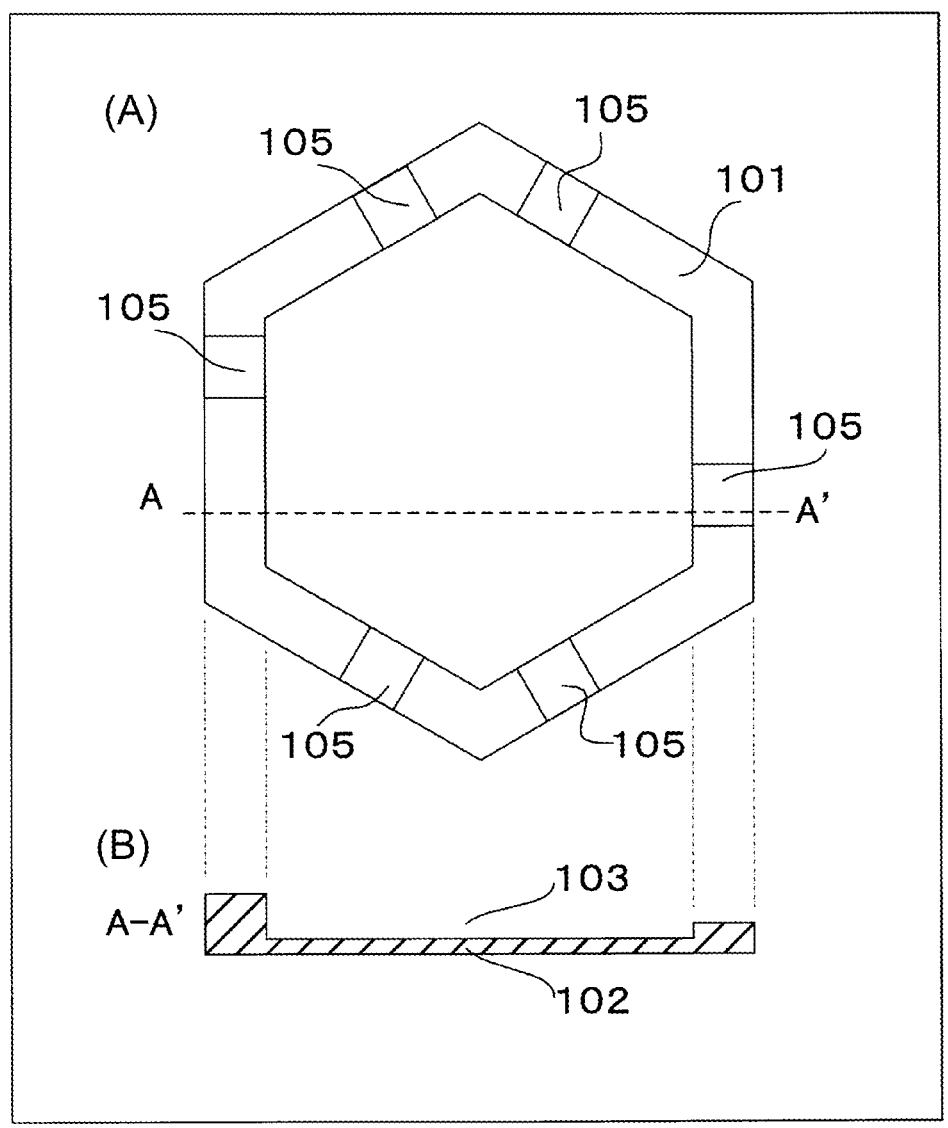
FIG. 12 is a diagram illustrating the structure of a semiconductor device according to Embodiment 7 of the invention.
Figure 13:
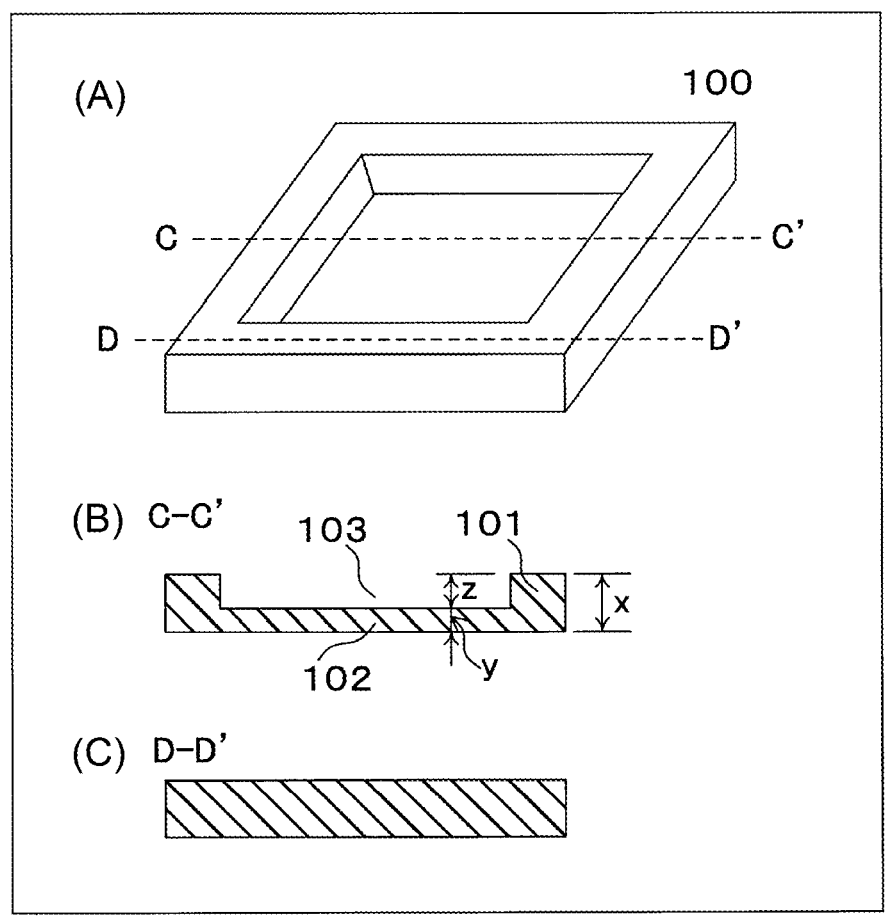
FIG. 13 is a diagram illustrating the rear surface structure of a semiconductor chip according to the related art.
Figure 14:
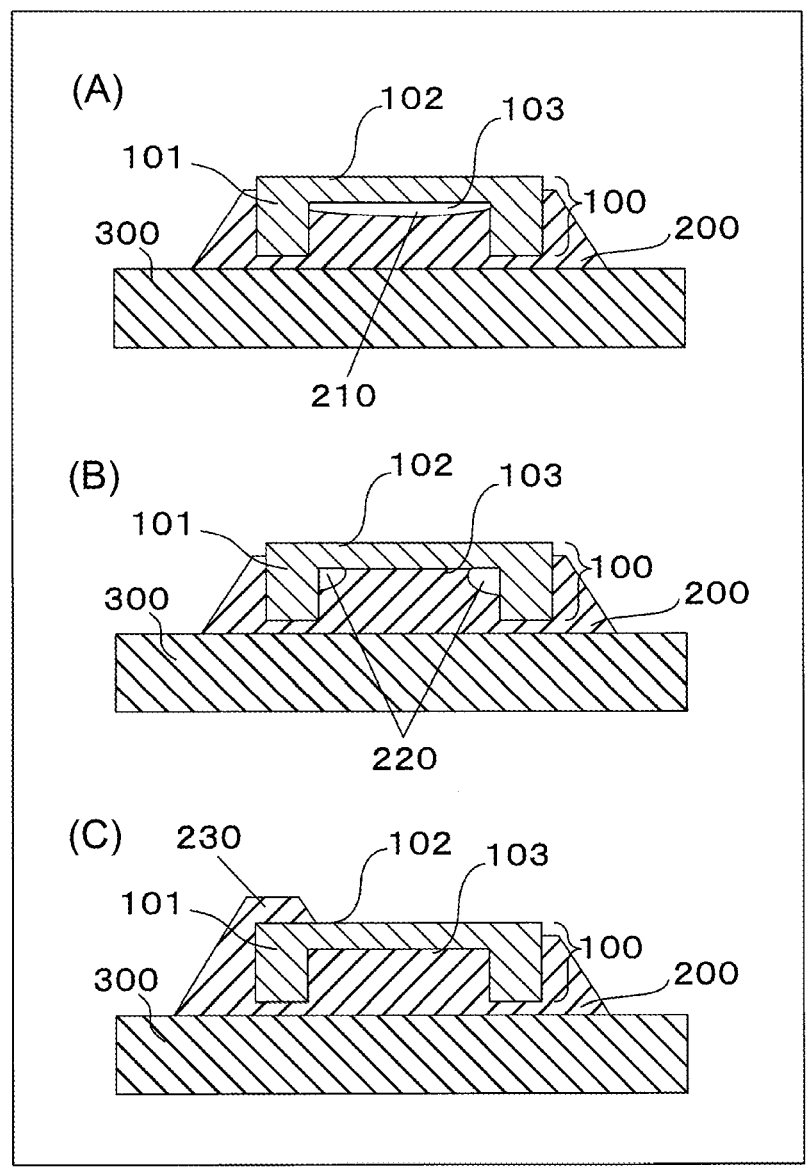
FIG. 14 is a cross-sectional view illustrating the state of the semiconductor chip illustrated in FIG. 13 after mounting.

In Embodiment 7, the shape of the chip according to Embodiment 1 is changed. FIG. 12 is a diagram illustrating the structure of a semiconductor device according to Embodiment 7 of the invention. FIG. 12(A) is a plan view illustrating a semiconductor chip as viewed from the rear surface and FIG. 12(B) is a cross-sectional view taken along the line A-A' of FIG. 12(A). In Embodiment 7, the semiconductor chip uses the c-axis of a hexagonal crystal structure and the chip has a hexagonal shape. In Embodiment 7, dry etching is used in a dicing process in order to process the complicated shape. When this structure is used, it is possible to process the shape of a concave portion 103 provided in the rear surface of the chip into a shape close to a circle, without reducing the number of semiconductor chips obtained from each wafer. Therefore, a void is less likely to be generated in the concave portion 103. In this example, measures to suppress the rotation of the semiconductor chip are not taken in a groove 105. However, the shape of the groove 105 may be changed as in Embodiments 1 and 2 to take measures to suppress the rotation of the semiconductor chip.

In all of Embodiments 5, 6, and 7, when the semiconductor chip was mounted on a base substrate, a void was not found from the concave portion 103 and the wetting of solder was not found in visual inspection.

In all of Embodiments 5, 6, and 7, even when the solder was melted, the semiconductor chip hardly rotated and was stable. In particular, in Embodiment 7 in which the concave portion provided in the rear surface of the chip has a hexagonal shape, even though there were no measurements to suppress the rotation of the semiconductor chip, the semiconductor chip hardly rotated. In addition, in all of Embodiments 5, 6, and 7, it was possible to stably mount the semiconductor chip on the base substrate, without damaging the semiconductor chip.

As described above, according to the invention, the grooves for air ventilation is provided in the rib which is provided in the rear surface of the semiconductor chip. Therefore, when solder is melted, air in the concave portion comes out of the grooves provided in the rib and the solder is uniformly spread in the concave portion, which makes it possible to prevent a defect caused by a void. In this case, the grooves provided in opposite sides of the rib are not arranged on the same straight line in the direction in which the groove traverses the rib from the inside to the outside. Therefore, it is possible to minimize a reduction in the mechanical strength of the semiconductor chip due to the grooves provided in the rib.

In the above-described embodiments of the invention, the vertical MOSFET is manufactured. However, the invention is not limited thereto. The invention can be applied to all types of vertical transistors and all types of vertical elements, such as vertical diodes. In addition, the invention is not limited to the above-described embodiments and various modifications and changes of the invention can be made without departing from the scope and spirit of the invention. For example, in each embodiment, the rib is formed so as to face the breakdown voltage structure portion. However, the invention is not limited thereto. The concave portion may extend to the breakdown voltage structure portion and the width of the rib may be reduced. In addition, the manufacturing process is not limited to the above-described embodiments. The protective film (not illustrated) may be a polyimide film and may have the function of the outer circumference protective film. The rib provided in one element may have a net-shaped structure and may have a plurality of concave portions, or the rib may have a planar structure including at least one set of opposite sides. In this embodiment, SiC is used as the semiconductor material. However, the invention can be applied to a vertical element in which GaN is used as the semiconductor material. In this case, the same effect as described above is obtained.

INDUSTRIAL APPLICABILITY

As described above, the semiconductor device according to the invention is useful for a vertical semiconductor device which is made of a semiconductor material with a wider band gap than Si.

EXPLANATIONS OF LETTERS OR NUMERALS 10 n-TYPE SUBSTRATE
11 n⁻ DRIFT LAYER
12 p⁺ BASE REGION
13 p-TYPE EPITAXIAL REGION
14 n-TYPE J-FET REGION
15 n⁺ SOURCE REGION
16 p⁺ COLLECTOR REGION
17 GATE INSULATING FILM
18 GATE ELECTRODE
19 INTERLAYER INSULATING FILM
20 SOURCE ELECTRODE
21 n⁺ COLLECTOR LAYER
22 DRAIN ELECTRODE
23, 104 OUTER CIRCUMFERENCE PROTECTIVE FILM
30 BREAKDOWN VOLTAGE STRUCTURE PORTION
40 ACTIVE REGION
100 SEMICONDUCTOR CHIP
101 SUPPORT (RIB)
102 FRONT SURFACE ELEMENT STRUCTURE
103 CONCAVE PORTION
105 GROOVE
200 SOLDER
210, 220 VOID
230 WETTING OF SOLDER
300 BASE SUBSTRATE

What is claimed is:

1. A semiconductor device comprising:
a device structure that is provided on a front surface of a semiconductor substrate in order to make a current flow in a thickness direction of the semiconductor substrate;
a concave portion that is provided in a rear surface of the semiconductor substrate opposite to the device structure;
a rib that forms outer circumferential side walls around the concave portion, and has a larger thickness than a portion of the semiconductor substrate in which the concave portion is formed; and
a plurality of grooves that are provided in the rib and traverse the rib from an inner circumference to an outer circumference of the rib;
wherein a width of the concave portion is greater than a width of the grooves.

2. The semiconductor device according to claim 1, wherein the rib has at least one set of opposite sides, and a traverse direction of the groove which is provided in one of the opposite sides of the rib and a traverse direction of the groove which is provided in another side of the opposite sides are not aligned on a same straight line.

3. The semiconductor device according to claim 1, wherein a depth of the groove is less than a depth of the concave portion.

4. The semiconductor device according to claim 2, wherein a depth of the groove is equal to a depth of the concave portion.

5. The semiconductor device according to claim 2, wherein the outer circumference of the semiconductor substrate has a rectangular shape.

6. The semiconductor device according to claim 1, wherein the outer circumference of the rib has a same shape as the outer circumference of the semiconductor substrate and has a polygonal shape having at least two sets of opposite sides, and
the groove is provided in each side of the at least two sets of opposite sides or in a portion including each of corners of the inner circumference of the rib or each of corners of the outer circumference of the rib.

7. The semiconductor device according to claim 6, wherein the groove is arranged at one end of each side of the at least two sets of opposite sides.

8. The semiconductor device according to claim 1, wherein an outer circumferential portion of the front surface of the semiconductor substrate is covered with a polyimide-based resin.

9. The semiconductor device according to claim 1, wherein a thickness of a portion of the semiconductor substrate in which an element structure is formed is equal to or greater than 5 micrometers and equal to or less than 30 micrometers.

10. A device, comprising:
a semiconductor chip having a surface for connecting to a base substrate;
wherein a border of the surface has at least one groove formed therein;
wherein the border has a plurality of grooves asymmetrically located around the border; and wherein the plurality of grooves open onto a substantially central concavity in the surface.

11. The device of claim 10, wherein the border has at least two opposing sides and each of the at least two opposing sides has a groove formed therein.

12. The device of claim 10, wherein the at least one groove widens from an inside of the border toward an outside of the border.

13. The device of claim 10, wherein the border has at least two grooves formed in respective opposite sides of the border, and each of the at least two grooves is offset with respect to a line bisecting the respective opposite sides.

14. The semiconductor device according to claim 1, wherein one side wall of a groove which is close to a corner of the rib is inclined toward the corner of the rib with respect to another side wall such that a width of the groove which is close to the corner of the rib increases from an inside to an outside.

15. The semiconductor device according to claim 1, wherein one side wall of a groove which is away from a corner of the rib is inclined toward the corner of the rib with respect to another side wall such that a width of the groove which is away from the corner of the rib on an inner circumferential side of the rib is greater than a width on an outer circumferential side and is reduced from an inside to an outside.

16. The semiconductor device according to claim 1, wherein the plurality of grooves are provided in each of the outer circumferential sidewalls of the rib.

\* \* \* \* \*